United States Patent
Chason et al.

(10) Patent No.: US 6,780,733 B2
(45) Date of Patent: Aug. 24, 2004

(54) THINNED SEMICONDUCTOR WAFER AND DIE AND CORRESPONDING METHOD

(75) Inventors: Marc Chason, Schaumburg, IL (US); Paul Brazis, South Elgin, IL (US); Krishna Kalyanasundaram, Chicago, IL (US); Daniel Gamota, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 53 days.

(21) Appl. No.: 10/236,619

(22) Filed: Sep. 6, 2002

(65) Prior Publication Data

US 2004/0048445 A1 Mar. 11, 2004

(51) Int. Cl.[7] ............................................. H01L 21/301
(52) U.S. Cl. ...................... 438/464; 438/455; 438/458
(58) Field of Search ................................ 438/464, 455, 438/458

(56) References Cited

U.S. PATENT DOCUMENTS

| | | | | |
|---|---|---|---|---|
| 5,028,558 A | * | 7/1991 | Haisma et al. ................. | 438/3 |
| 5,473,433 A | * | 12/1995 | Miller ......................... | 356/514 |
| 6,013,534 A | * | 1/2000 | Mountain ..................... | 438/15 |
| 6,214,733 B1 | * | 4/2001 | Sickmiller ................... | 438/691 |
| 6,252,791 B1 | | 6/2001 | Wallace et al. | |
| 6,337,258 B1 | * | 1/2002 | Nakayoshi et al. .......... | 438/464 |
| 6,342,434 B1 | * | 1/2002 | Miyamoto et al. ........... | 438/464 |
| 6,399,464 B1 | * | 6/2002 | Muntifering et al. ........ | 438/465 |
| 6,425,971 B1 | * | 7/2002 | Silverbrook ................. | 156/230 |
| 6,461,938 B2 | * | 10/2002 | Nakabayashi ............... | 438/458 |
| 6,492,195 B2 | * | 12/2002 | Nakanishi et al. ........... | 438/108 |
| 6,494,927 B2 | * | 12/2002 | Cho et al. ..................... | 51/297 |
| 6,551,906 B2 | * | 4/2003 | Oka ............................ | 438/465 |
| 6,586,338 B2 | * | 7/2003 | Smith et al. ................. | 438/692 |

* cited by examiner

*Primary Examiner*—Long Pham

(57) ABSTRACT

A wafer (10) having integrated circuit elements formed therein is thinned and a first carrier (41) is adhered thereto. The first carrier (41) facilitates handling of the thinned wafer (30). A second carrier (51) is then adhered as well and the various integrated circuits are singulated to yield a plurality of thinned die (81). Once the thinned die is mounted to a desired substrate (91), the first carrier (41) is readily removed. In one embodiment, the first carrier (41) has an adhesive that becomes less adherent when exposed to a predetermined stimulus (such as a given temperature range or a given frequency range of photonic energy). Such thinned die (or modules containing such die) are readily amenable to stacking in order to achieve significantly increased circuit densities.

37 Claims, 2 Drawing Sheets

THINNED SEMICONDUCTOR WAFER AND DIE AND CORRESPONDING METHOD

TECHNICAL FIELD

This invention relates generally to semiconductor wafers and dies.

BACKGROUND

Semiconductor manufacturing is well understood in the art. Various methods are known to process a wafer comprised of one or more semiconductor materials to produce a plurality of solid state integrated circuits (as used herein, "solid state integrated circuits" and similar expressions shall be generally understood to refer to a wide range of devices and apparatus, including electric circuits, optical devices, and micro-electronic mechanical systems (MEMS)). In general, significant progress has been made with respect to reducing the area of semiconductor material required to yield such integrated circuits. Such progress has led to a considerable reduction in size of application devices that, in turn, utilize such integrated circuits (such as, for example, cellular telephones, computers, and memory devices).

Unfortunately, a similar progression does not characterize the overall volume for such integrated circuits. Wafer/die depths of no less than 125 to 150 microns are generally considered the minimum height for wafers and dies bearing integrated circuits under ordinary manufacturing conditions. Thinner dimensions tend to result in wafers and dies that are too fragile to reliably handle or manipulate. While such dimensions have been satisfactory for most applications in the past, there are present needs for thinner wafers and/or dies. For example, memory density needs continue to grow. As area improvements in the X–Y domain become more difficult and costly to attain, reduced height requirements offer one avenue for improving memory density for at least some products.

BRIEF DESCRIPTION OF THE DRAWINGS

The above needs are at least partially met through provision of the thinned semiconductor wafer and die and corresponding method described in the following detailed description, particularly when studied in conjunction with the drawings, wherein.

Figure 1:
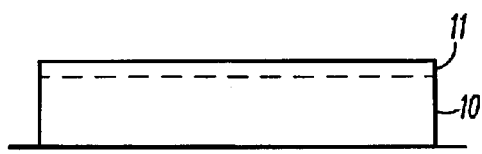
FIG. 1 comprises a side elevational view of a wafer as configured in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are typically not depicted in order to facilitate a less obstructed view of these various embodiments of the present invention.

DETAILED DESCRIPTION

Generally speaking, pursuant to these various embodiments, a semiconductor wafer having a plurality of integrated circuits formed therein is thinned. In a preferred embodiment the thinning is substantially even across the wafer. The thinning can be to a desired depth (such as, for example, 25 to 50 microns) and will in any event typically result in a wafer having a thickness of no more than 100 microns. Also in a preferred embodiment, the thinning will occur on a side of the wafer that is opposite to the side where the active devices comprising the integrated circuits have been formed.

A first carrier is attached to a side of the wafer (for flip-chip applications, the first carrier will typically be attached to the non-active side of the wafer, while for wire-bonding applications, the first carrier will typically be attached to the active side of the wafer). In a preferred embodiment, this first carrier comprises a conformal material, such as a tape, that attaches to the wafer with an adhesive. Preferably, the adhesive becomes less adherent when exposed to a first predetermined stimulus such as a given temperature range or a given frequency range of photonic energy. This first carrier, though typically somewhat flexible, is rigid enough to thereafter permit relatively normal handling of the wafer notwithstanding the considerably reduced thickness of the wafer. A second carrier is then attached, preferably over the first carrier. This second carrier is also preferably affixed with an adhesive that will become less adherent when exposed to a predetermined stimulus. This second carrier serves to aid in singulating individual dies from the wafer.

Individual dies are then formed by cutting through the wafer and the first carrier. In a preferred embodiment, the second carrier is partially but not fully cut. The second carrier is then exposed to the appropriate stimulus to reduce the adherent capacity of its corresponding adhesive and the individual dies are then singulated and removed. In a preferred embodiment, when so removed, the dies still have the first carrier attached thereto.

The dies are then placed on a substrate of choice and processed accordingly to affix them in place. The first carrier is then exposed to the first predetermined stimulus to release the first carrier from the die to thereby facilitate removal of the first carrier from the die. So configured, a considerably thinned die is reliably manipulated and mounted in place where desired. By stacking such dies, or by stacking modules that include such dies, circuit densities are obtainable that were not generally available in the past.

Referring now to the drawings, and in particular to FIG. 1, a semiconductor wafer 10 has a plurality of solid state integrated circuits formed in an active region 11 thereof. The wafer can be comprised of any appropriate semiconductor material (including but not limited to silicon, germanium, gallium arsenide, gallium nitride, silicon germanium, and indium phosphide) and can be provided in any desired form factor (including but not limited to disc-shaped wafers having a diameter of 2, 3, 4, 6, 8, or 12 inches as well understood in the art). The embodiments taught below are compatible with a variety of semiconductor manufacturing technologies and consequently a manufacturing technology of choice can be selected for use when forming the integrated circuits in the active region 11.

Figure 2:
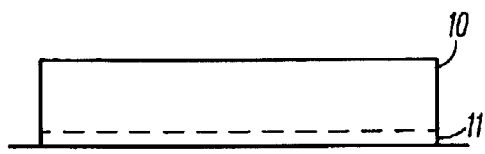
FIG. 2 comprises a side elevational view of a wafer as configured in accordance with an embodiment of the invention.

With reference to FIG. 2, the wafer 10 is inverted such that the side of the wafer that is opposite the active region 11 is exposed. The purpose of inverting the wafer 10 is to permit subsequent processing as described below. To the extent that such processing can be effected without inverting the wafer, such inversion could be omitted.

Figure 3:
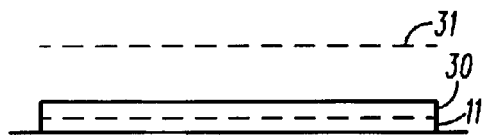
FIG. 3 comprises a side elevational view of a thinned wafer as configured in accordance with an embodiment of the invention.

The wafer 10 as provided will have a thickness that exceeds 150 microns (in fact, the wafer 10 may, in a given embodiment, exceed 150 microns by a considerable amount). Referring now to FIG. 3, the wafer 10 is thinned from an initial thickness 31 to a final thickness to thereby yield a thinned wafer 30. Thinning occurs as a result of removing material from the wafer 10 (and, in a preferred embodiment, from a side of the wafer 10 that is opposite the active region 11). Such material can be removed in a variety of ways, including by use of an abrasive material (such as, for example, a CNC milling process), a chemically-based material removal method, and or a plasma-based material removal method, all as well understood in the art. In a preferred embodiment the material is removed substantially equally across the wafer 10. If desired, of course, the thickness of the wafer 10 could be left relatively unequal to suit some desired purpose or intent.

The amount of material removed will correspond to the desired final thickness. For example, an average thickness of 100 microns, 50 microns, or even 25 microns are all attainable through the material removal processes noted. In fact, even thinner wafers are potentially possible and useful, depending to some extent upon the relative thickness of the active region 11 itself.

Figure 4:
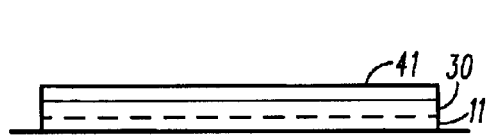
FIG. 4 comprises a side elevational view of a thinned wafer with a first carrier as configured in accordance with an embodiment of the invention.

Referring to FIG. 4, the thinned wafer 30 has a first carrier 41 disposed thereon. In a preferred embodiment, this first carrier 41 comprises a flexible material such as, for example, a tape. In a preferred embodiment the first carrier 41 attaches to the non-active side of the thinned wafer 30 by use of an adhesive. Also in a preferred embodiment, the adhesive used will tend to become less adherent when exposed to a predetermined stimulus. For example, there are tapes available that use adhesives that become considerably less adherent when the tape is exposed to specific frequencies of photonic energy (such as ultraviolet light) or temperatures in excess of a predetermined threshold. In a preferred embodiment, a thermally responsive tape is used having an adhesive that becomes considerably less adherent when exposed to temperatures in excess of 75 degrees centigrade. This first carrier 41 provides support to facilitate subsequent handling of the thinned wafer 30. As a result, it may be desirable to have the first carrier 41 overlap the thinned wafer 30 by some amount, or to substantially match the perimeter of the thinned wafer 30, or to only partially cover the thinned wafer 30 depending upon the overall embodiment and/or degree and kind of anticipated subsequent handling of the thinned wafer 30.

Figure 5:
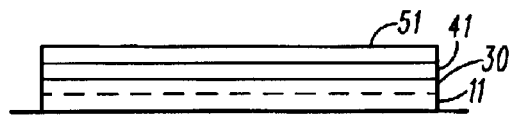
FIG. 5 comprises a side elevational view of a thinned wafer with a first and second carrier as configured in accordance with an embodiment of the invention.

Referring now to FIG. 5, a second carrier 51 is also disposed over the thinned wafer 30. In a preferred embodiment, the second carrier 51 is disposed over and adheres to the first carrier 41 (for certain purposes or to accommodate certain processes, it may be desirable to locate the second carrier 51 on the side opposite the first carrier 41). Also in a preferred embodiment, the adhesive used to couple the second carrier 51 will become substantially less adherent when exposed to a corresponding predetermined stimulus. In general, for most purposes, it is better if the second carrier 51 responds to a different predetermined stimulus than the first carrier 41. For example, in a preferred embodiment, the first carrier 41 responds to a particular temperature range and the second carrier 51 responds to a particular frequency range of photonic energy (such as ultraviolet light). The second carrier 51 serves to facilitate singulation of the various integrated circuits that comprise the thinned wafer 30 as described below.

So configured, a thinned wafer has two carriers attached thereto. The first carrier in particular serves to facilitate subsequent handling of the thinned wafer, thereby permitting considerable movement and placement of the thinned wafer without a corresponding detrimental impact on yield.

Figure 6:
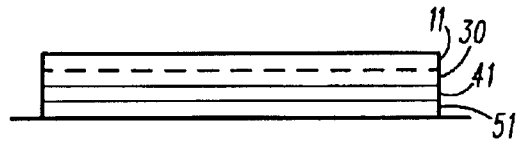
FIG. 6 comprises a side elevational view of a thinned wafer with a first and second carrier as configured in accordance with an embodiment of the invention.
Figure 7:
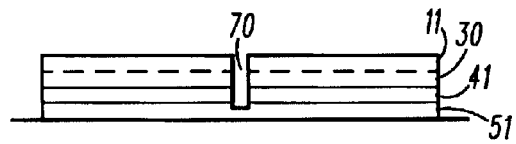
FIG. 7 comprises a side elevational view of a thinned wafer with two carriers during singulation as configured in accordance with an embodiment of the invention.

Referring now to FIG. 6, the thinned wafer 30 is again inverted, thereby outwardly orienting the active region 11 and inwardly orienting, in this embodiment, the second carrier 51. Referring now to FIG. 7, the various integrated circuits comprising the active region 11 of the thinned wafer 30 are singulated by cutting through the thinned wafer 30 and the first carrier 41. In a preferred embodiment, a portion, but not all, of the second carrier 51 is also cut in this same fashion. Such cutting forms slots 70 that define now-segregated portions of the thinned wafer 30. By now exposing the second carrier 51 to its predetermined stimulus, the adhesive that holds the second carrier 51 in place will weaken and allow the singulated portions to be removed in accordance with well understood prior art technique and practice (typically through use of a mechanical pin that urges the singulated portion away from the second carrier 51 and the remaining portions of the thinned wafer 30).

Figure 8:
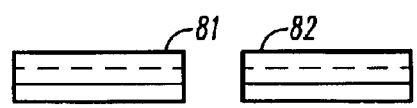
FIG. 8 comprises a side elevational view of two singulated thinned dies as configured in accordance with an embodiment of the invention.

Referring now to FIG. 8, singulated dies 81 and 82 each comprise their apportioned thinned wafer segment along with a corresponding section of the first carrier. Although each die is now considerably thinner than is typical (ranging, for example, from 25 to 100 microns in thickness as desired), the first carrier aids in ensuring that the dies can be handled, picked, placed, and otherwise manipulated without damaging the die.

Figure 9:
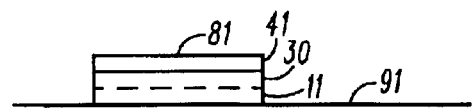
FIG. 9 comprises a side elevational view of a thinned die with a first carrier on a substrate as configured in accordance with an embodiment of the invention.
Figure 10:
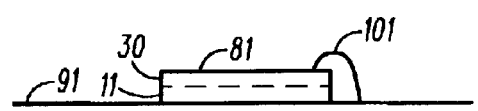
FIG. 10 comprises a side elevational view of a thinned die as mounted on a substrate as configured in accordance with an embodiment of the invention.

The die 81 can now be placed and affixed to a suitable substrate 91 as depicted in FIG. 9 and in accordance with well understood prior art technique. For example, the die 91 can be secured in place using flip chip technology (also often referred to as direct chip attachment) or by any other means, including standard solder reflow methodology. Exposing the first carrier 41, in this embodiment, to heat in excess of 75 degrees centigrade will cause the first carrier's adhesive to weaken, which, in this embodiment, is desired. Such heat will often be sufficiently provided during the die affixment process. Otherwise, such heat can be applied as an additional part of the process. With reference to FIG. 10, the first carrier 41 is then readily removed (for example, by a tweezer-like apparatus or through use of an appropriate liquid flush process). At this point, the thinned die 81 is now mounted to the substrate 91 in ordinary fashion (when flip chip mounting techniques have not been used, or when additional connections are otherwise desired, such connections can then be made using, for example, wirebonding 101 techniques).

Figure 11:
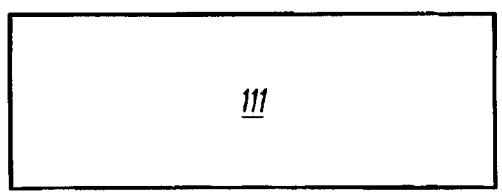
FIG. 11 comprises a side elevational view of a prior art wafer.
Figure 12:
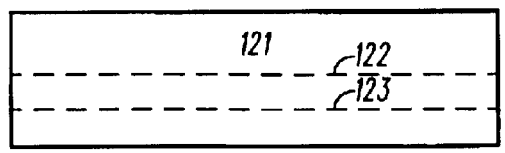
FIG. 12 comprises a side elevational view of a thinned wafer as configured in accordance with an embodiment of the invention.

It will therefore be appreciated that the active portions of the wafer and die are not impacted by the present embodiments. Conversely, virtually any methods and techniques used to fabricate the active region of the wafer/die can still be used compatibly with the disclosed embodiments. Furthermore, all presently available techniques for mounting dies to a substrate remain similarly available for compatible use with these embodiments. Notwithstanding these similarities, however, a significant difference exists between the thinned wafer and die of these embodiments and the ordinary wafer and die of the prior art. An ordinary wafer 111 as shown in FIG. 11 will ordinarily have a thickness no less than 125 microns and very often will have a considerably greater thickness. The thinned wafer 121 of these embodiments, however, can be considerably thinner as shown in FIG. 12. As shown, a thinned wafer 121 of 100 microns in height is readily achievable. More dramatically, a thinned wafer having a height 122 of only 50 microns is similarly achievable. And, as disclosed above, these embodiments can be used to achieve a thinned wafer having a height 123 of only 25 microns if desired. (Other heights corresponding to dimensions within this range are of course also available.)

One potential benefit of significantly reducing the height of an integrated circuit die appears when stacking a plurality of such dies (or a plurality of modules containing such dies) in a confined space in order to produce a combined device having a thin form factor. For example, with reference to FIG. 13, a substrate 131 (such as a conformal FR-4 material, BT material, ceramic, polyester, or a polyimide flex material) has a plurality of thinned dies 81 disposed thereon (for purposes of this example, the thinned dies 81 each comprise a memory circuit as well understood in the art). These memory circuits each couple via conductive traces (not shown for purposes of simplicity and clarity) to side conductors 132 as is also well known in the art. Depending upon the particular substrate material used, the thickness of the substrate will be less than approximately 170 microns (with polyimide flex typically providing a relatively thinner substrate). The thinned dies 81 themselves can be readily provided with a thickness of between 25 to 100 microns and for purposes of this illustration, it will be presumed that each die has an average thickness of 25 microns. Flip chip mounting materials will contribute another 1 or 2 microns of height to the combined assembly. Standard soldering materials could add anywhere from 6 to 50 microns. It can therefore be seen that a multi-die memory module can be provided that has an overall thickness of only about 86 microns. Such an assembly is therefore seen to be thinner than a prior art die viewed alone.

Figure 13:
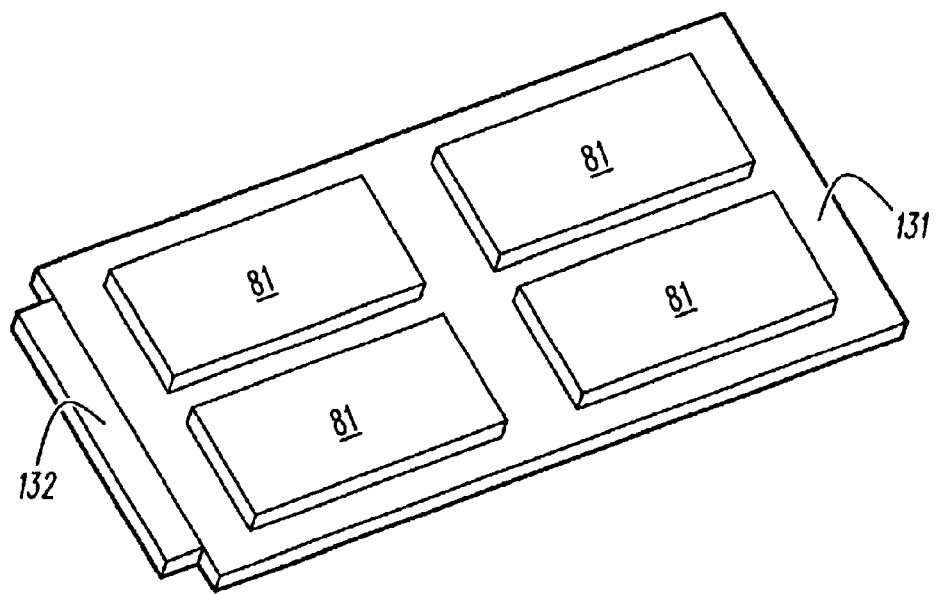
FIG. 13 comprises a perspective view of a substrate having four thinned as configured in accordance with an embodiment of the invention.

If desired, the assembly as illustrated in FIG. 13 can be stacked and mounted atop other such assemblies (with appropriate conductive vias and traces on and through the substrates being used to appropriately intercouple the various memory circuits and edge connectors). Such a combination is still considerably less than 190 microns in depth, which is still less in aggregation than a prior art die combined with a relatively thin substrate. In effect, then, the memory density of the resultant assembly is virtually doubled for the thinned die embodiment as compared to the prior art embodiment. Since the thinned embodiments can also benefit from every X–Y plane density improvement that can be offered to the prior art embodiment, this density volume benefit and improvement constitutes an essentially constant advantage. Such a significant improvement in circuit density can be important in products where form factor requirements are limited in this regard (such as for a memory card, SecureDigital cards, and the like).

By vertically stacking such assemblies, as already noted, circuit density can be greatly increased. For example, when the assemblies comprise state of the art memory circuits, a memory module comprised of stacked thin dies (or stacked modules containing such thin dies) can achieve a total data storage density of at least 0.648 megabytes per cubic millimeter. This represents a significant improvement over past modules and efforts.

Figure 14:
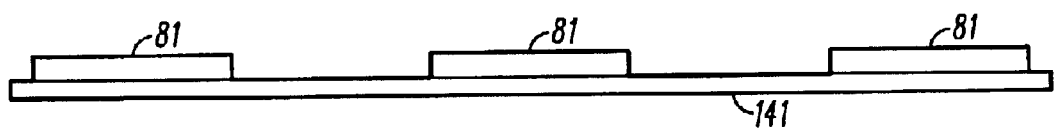
FIG. 14 comprises a side elevational view of three thinned dies mounted on a conformal substrate as configured in accordance with an embodiment of the invention.
Figure 15:
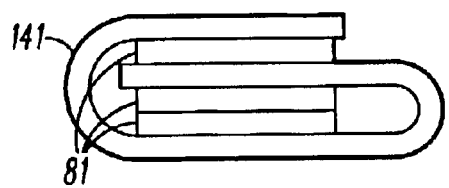
FIG. 15 comprises a side elevational view of a stack of three thinned dies as configured in accordance with an embodiment of the invention.
Figure 16:
FIG. 16 comprises a side elevational view of a stack of three thinned dies as configured in accordance with another embodiment of the invention.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. For example, there are numerous other ways by which one may stack thinned dies to increase effective circuit density. With reference to FIG. 14, as one illustration, a plurality of thinned dies 81 can be mounted to a flexible substrate 141 (such as Kapton or the like), which flexible substrate 141 is then folded over upon itself as shown in FIG. 15 to stack the dies 81 into a relatively small overall size. As another illustration, and referring now to FIG. 16, thinned dies of increasingly smaller size can be directly stacked one atop the other with wirebonding then serving to electrically couple the dies to a substrate. In particular, to stack three such dies, a first die 162 can be attached to a substrate 161. A slightly smaller die 163 can then be attached to the top of the first die 162 and a smaller still die 164 can then be attached to the top of the middle die 163. Wirebonding 165 can then be used to couple conductive pads on the upper surfaces of the dies, which conductive pads are left exposed by the smaller size of the dies that are coupled to such upper surfaces, to appropriate conductive pads on the substrate 161.

As another modification, it would be possible to include an underfill material on the active side of the wafer or die. Such an underfill material can act as a planarizing medium for the thinned die in addition to serving as an underfill material in ordinary course. Such an underfill material may be especially useful during solder-attach flip chip assembly to increase the reliability of the solder joints.

We claim:

1. A method comprising the steps of:
   providing a semiconductor wafer;

attaching at least two carriers to the semiconductor wafer, wherein:
  a first one of the at least two carriers is attached with respect to the semiconductor wafer using a first adhesive that tends to become substantially less adherent when exposed to a first predetermined stimulus; and
  a second one of the at least two carriers is attached with respect to the semiconductor wafer using a second adhesive that tends to become substantially less adherent when exposed to a second predetermined stimulus, wherein the second adhesive is different from the first adhesive and the second predetermined stimulus is different from the first predetermined stimulus.

2. The method of claim 1 wherein providing a semiconductor wafer includes providing a semiconductor wafer comprised of at least one of silicon, germanium, gallium arsenide, gallium nitride, silicon germanium, and indium phosphide.

3. The method of claim 1 wherein providing a semiconductor wafer includes providing a semiconductor wafer having a plurality of integrated circuits formed therein.

4. The method of claim 3 wherein providing a semiconductor wafer having a plurality of integrated circuits formed therein includes providing a semiconductor wafer having a plurality of solid state memory circuits formed therein.

5. The method of claim 1 wherein providing a semiconductor wafer includes thinning the semiconductor wafer.

6. The method of claim 5 wherein thinning the semiconductor wafer includes thinning the semiconductor wafer to an average thickness of not more than about 100 microns.

7. The method of claim 6 wherein thinning the semiconductor wafer to an average thickness of not more than about 100 microns includes thinning the semiconductor wafer to an average thickness of not more than about 50 microns.

8. The method of claim 7 wherein thinning the semiconductor wafer to an average thickness of not more than about 50 microns includes thinning the semiconductor wafer to an average thickness of not more than about 25 microns.

9. The method of claim 5 wherein thinning the semiconductor wafer includes thinning the semiconductor wafer using at least one of an abrasive material, a chemical material-removal process, and a plasma process.

10. The method of claim 1 wherein one of the first and second predetermined stimuli comprises elevated temperature.

11. The method of claim 10 wherein the elevated temperature comprises temperatures in excess of about 75 degrees centigrade.

12. The method of claim 1 wherein one of the first and second predetermined stimuli comprises photonic energy.

13. The method of claim 1 wherein attaching a carrier to a surface of the semiconductor wafer includes attaching a conformal carrier to a surface of the semiconductor wafer.

14. The method of claim 1 wherein attaching a carrier to a surface of the semiconductor wafer includes attaching the carrier to a non-active surface of the semiconductor wafer.

15. A method comprising:
  providing a semiconductor wafer;
  attaching a first carrier to the wafer;
  attaching a second carrier to at least portions of the first carrier;
  singulating at least one die from the semiconductor wafer, which die is then removed from proximity to the second carrier but remains attached to the first carrier.

16. The method of claim 15 wherein providing a semiconductor wafer includes providing a semiconductor wafer comprised at least in part of at least one of silicon, germanium, gallium arsenide, gallium nitride, silicon germanium, and indium phosphide.

17. The method of claim 15 wherein providing a semiconductor wafer comprises providing at least one of a 2, 3, 4, 6, 8, and 12 inch semiconductor wafer.

18. The method of claim 15 wherein the semiconductor wafer has an average thickness no greater than about 100 microns.

19. The method of claim 16 wherein the semiconductor wafer has an average thickness no greater than about 50 microns.

20. The method of claim 17 wherein the semiconductor wafer has an average thickness no greater than about 25 microns.

21. The method of claim 15 wherein attaching a first carrier to the wafer includes attaching a conformal carrier to the wafer.

22. The method of claim 21 wherein attaching a conformal carrier to the wafer includes using an adhesive to attach the flexible carrier to the wafer.

23. The method of claim 22 wherein using an adhesive includes using an adhesive that tends to become considerably less adherent when exposed to a predetermined stimulus.

24. The method of claim 23 wherein the predetermined stimulus is at least one of an elevated temperature and photonic energy of at least a predetermined frequency.

25. The method of claim 15 wherein attaching a first carrier to the wafer includes attaching the first carrier to a non-active side of the wafer.

26. The method of claim 15 wherein providing a semiconductor wafer includes providing a semiconductor wafer having a plurality of separate integrated circuits formed therein.

27. The method of claim 15 and further comprising, prior to attaching the first carrier, thinning the semiconductor wafer.

28. The method of claim 27 wherein thinning includes using at least one of an abrasive material, a chemical material-removal process, and a plasma process.

29. The method of claim 15 wherein attaching a second carrier to at least portions of the first carrier includes attaching a second carrier by use of an adhesive to at least portions of the first carrier.

30. The method of claim 29 wherein attaching a second carrier by use of an adhesive includes attaching a second carrier by use of an adhesive that tends to become less adherent when exposed to at least certain frequencies of ultraviolet light.

31. The method of claim 15 wherein singulating includes cutting completely through the semiconductor wafer and the first carrier but only partially through the second carrier.

32. A method comprising:
  providing a semiconductor wafer having a plurality of integrated circuits formed therein;
  thinning the semiconductor wafer to an average thickness that is no greater than about 100 microns;
  attaching a first carrier to the semiconductor wafer with a first adhesive that tends to become substantially less adherent when exposed to a first predetermined stimulus;
  disposing a second carrier over at least a portion of the first carrier with a second adhesive that tends to become substantially less adherent when exposed to a second predetermined stimulus;
  forming a die by cutting through the semiconductor wafer and the first carrier to thereby singulate at least one integrated circuit;

removing the die;

disposing the die on a substrate;

exposing the first carrier to the first predetermined stimulus and removing at least most of the first carrier from the die.

33. The method of claim 32 wherein attaching a first carrier comprises attaching a thermal release film.

34. The method of claim 32 wherein thinning comprises thinning the semiconductor wafer to an average thickness that is no greater than about 50 microns.

35. The method of claim 34 wherein thinning comprises thinning the semiconductor wafer to an average thickness that is no greater than about 25 microns.

36. The method of claim 32 wherein forming a die includes exposing the second carrier to the second predetermined stimulus.

37. The method of claim 36 wherein forming a die further includes partially but not fully cutting through the second carrier.

* * * * *